United States Patent
Park et al.

(10) Patent No.: US 9,583,194 B2
(45) Date of Patent: Feb. 28, 2017

(54) MEMORY SYSTEM AND OPERATING METHOD THEREOF

(71) Applicant: SK hynix Inc., Gyeonggi-do (KR)

(72) Inventors: Young-Jin Park, Gyeonggi-do (KR); Jong-Ju Park, Gyeonggi-do (KR); Gi-Pyo Um, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/862,955

(22) Filed: Sep. 23, 2015

(65) Prior Publication Data

US 2016/0314842 A1    Oct. 27, 2016

(30) Foreign Application Priority Data

Apr. 27, 2015    (KR) .................... 10-2015-0059058

(51) Int. Cl.
*G11C 16/08* (2006.01)
*G11C 16/14* (2006.01)
*G11C 16/20* (2006.01)

(52) U.S. Cl.
CPC .............. *G11C 16/08* (2013.01); *G11C 16/14* (2013.01); *G11C 16/20* (2013.01)

(58) Field of Classification Search
CPC .......... G11C 16/08; G11C 16/20; G11C 16/14
See application file for complete search history.

(56) References Cited

U.S. PATENT DOCUMENTS

| | | | | |
|---|---|---|---|---|
| 2007/0076873 A1* | 4/2007 | Yamamoto | ....... | G11B 20/00086 380/241 |
| 2009/0204824 A1* | 8/2009 | Lin | ..................... | G06F 12/0246 713/193 |
| 2009/0323942 A1* | 12/2009 | Sharon | ................. | G11C 7/1006 380/44 |
| 2010/0088574 A1* | 4/2010 | Kim | .................... | G06F 11/1008 714/763 |
| 2010/0217921 A1* | 8/2010 | Mun | ................... | G06F 11/1072 711/103 |
| 2012/0005416 A1* | 1/2012 | Lee | ..................... | G06F 12/0246 711/103 |
| 2012/0287719 A1* | 11/2012 | Mun | ................... | G11C 16/0483 365/185.18 |

FOREIGN PATENT DOCUMENTS

KR    1020090074733    7/2009

\* cited by examiner

*Primary Examiner* — Douglas King
(74) *Attorney, Agent, or Firm* — IP & T Group LLP

(57) ABSTRACT

A memory system includes: a memory device comprising at least a page; and a controller suitable for setting a seed offset according to a size of a restricted region in the page, randomizing data using the seed offset at each cycle, and storing the randomized data in the page.

12 Claims, 12 Drawing Sheets

MEMORY SYSTEM AND OPERATING METHOD THEREOF

CROSS-REFERENCE TO RELATED APPLICATIONS

The present application claims priority of Korean Patent Application No. 10-2015-0059058, filed on Apr. 27, 2015, which is incorporated herein by reference in its entirety.

BACKGROUND

1. Field

Exemplary embodiments of the present invention relate to a memory system, and more particularly, to a memory system which randomizes data and processes the randomized data to a memory device, and an operating method thereof.

2. Description of the Related Art

The paradigm for the computing environment has changed to ubiquitous computing, so that computer systems can be used anytime and anywhere. Because of this, the use of portable electronic devices such as mobile phones, digital cameras, and notebook computers has rapidly increased. Such portable electronic devices generally use memory systems with memory devices, that is, data storage devices. Data storage devices are used as main memory or auxiliary memory devices within the portable electronic devices.

Data storage devices with memory devices are advantageous because the memory devices have no moving parts and thus have excellent stability and durability, high information access speed, and low power consumption. Examples of data storage devices having memory systems with these advantages include universal serial bus (USB) memory devices, memory cards having various interfaces, and solid state drives (SSD).

SUMMARY

Various embodiments are directed to a memory system capable of stably and efficiently processing data of a memory device by minimizing complexity and degradation in performance of the memory system, and an operating method thereof.

In an embodiment, a memory system may include: a memory device comprising at least a page; and a controller suitable for setting a seed offset according to a size of a restricted region in the page, randomizing data using the seed offset at each cycle, and storing the randomized data in the page.

The controller may randomize the data by shifting a column address of the page for the data according to the seed offset at each cycle.

The cycle may be one of a program/erase (P/E) cycle and an erase/write (E/W) cycle.

The seed offset may include a shift unit representing a shift amount of a column address for the data within the size of the restricted region at each cycle, and a maximum shift representing a maximum shift amount of the column address within the size of the restricted region.

The controller may randomize the data by shifting the column address in the page for the data by an amount of the shift unit at each cycle.

The controller may initialize the shifting of the column address when the shift amount of the column address reaches the maximum shift.

The restricted region may not be used for storing data in the pages.

The restricted region may include one or more of an unused region, a spare region, a remaining region, and a reserved region of the pages.

In an embodiment, an operating method of a memory system may include: temporarily storing data in at least a page of a memory device; setting a seed offset according to a size of a restricted region in the page; randomizing the data using the seed offset at each cycle; and storing the randomized data in the page.

The randomizing of the data may be performed by shifting a column address of the page for the data according to the seed offset at each cycle.

The cycle may be one of a P/E cycle and an E/W cycle.

The seed offset may include a shift unit representing a shift amount of a column address for the data within the size of the restricted region at each cycle, and a maximum shift representing a maximum shift amount of the column address within the size of the restricted region.

The randomizing of the data may be performed by shifting the column address in the page for the data by an amount of the shift unit at each cycle.

The randomizing of the data may initialize the shifting of the column address when the shift amount of the column address reaches the maximum shift.

The restricted region may not be used for storing data in the pages.

The restricted region may include one or more of an unused region, a spare region, a remaining region, and a reserved region of the pages.

DETAILED DESCRIPTION

Figure 1:
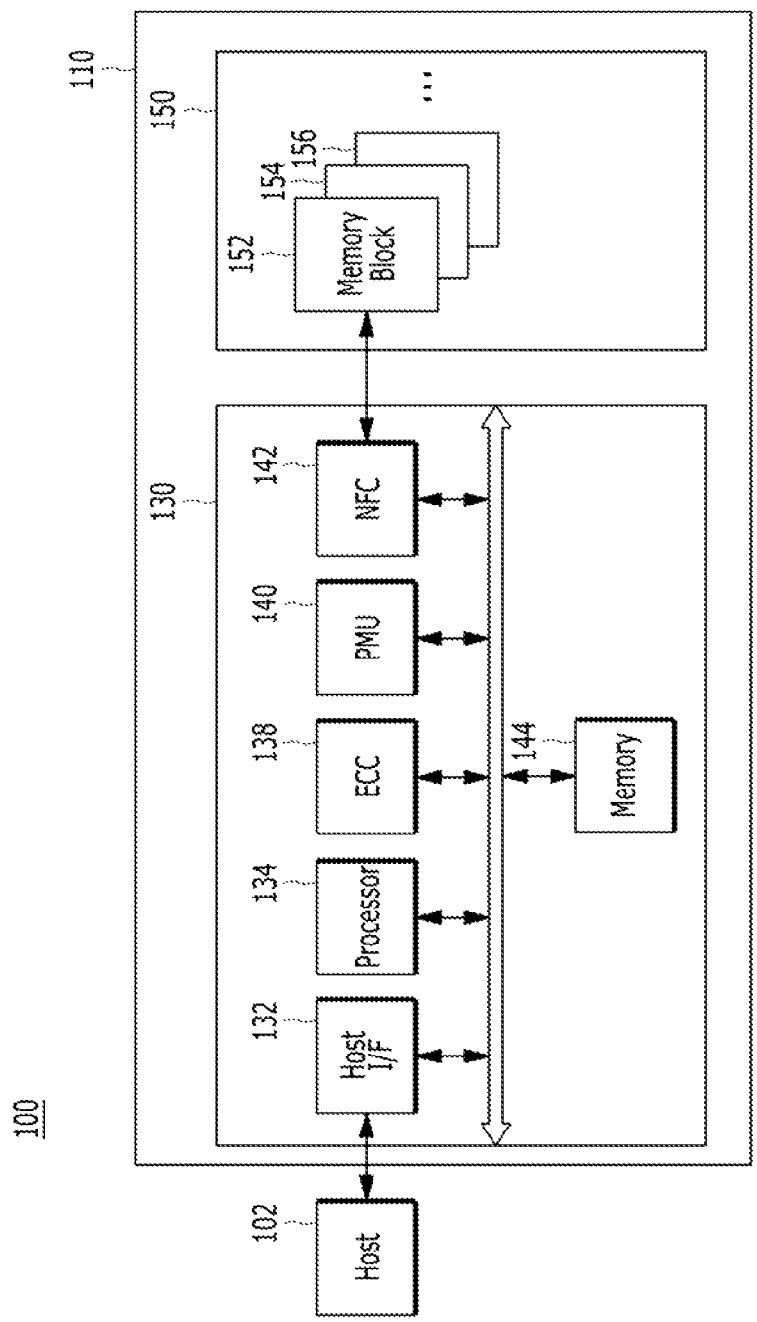
FIG. 1 is a block diagram illustrating a data processing system including a memory system in accordance with an embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via an intervening element therebetween. Furthermore, when it is described that one "comprises" (or "includes") or "has" some elements, it should be understood that it may comprise (or include) or have only those elements, or it may comprise (or include) or have other elements as well as those elements if there is no specific limitation. The terms of a singular form may include plural forms unless referred to the contrary.

FIG. 1 is a block diagram illustrating a data processing system including a memory system in accordance with an embodiment.

Referring to FIG. 1, the data processing system 100 may include a host 102 and a memory system 110.

The host 102 may include, for example, a portable electronic device such as a mobile phone, an MP3 player and a laptop computer or an electronic device such as a desktop computer, a game player, a TV and a projector.

The memory system 110 may operate in response to a request from the host 102, and in particular, store data to be accessed by the host 102. In other words, the memory system 110 may be used as a main memory system or an auxiliary memory system of the host 102. The memory system 110 may be implemented with any one of various kinds of storage devices, according to the protocol of a host interface to be electrically coupled with the host 102. The memory system 110 may be implemented with any one of various kinds of storage devices such as a solid state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CF) card, a smart media (SM) card, a memory stick, and so forth.

The storage devices for the memory system 110 may be implemented with a volatile memory device such as a dynamic random access memory (DRAM) and a static random access memory (SRAM), or a nonvolatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetic RAM (MRAM) and a resistive RAM (RRAM).

The memory system 110 may include a memory device 150 which stores data to be accessed by the host 102, and a controller 130 which may control storage of data in the memory device 150.

The controller 130 and the memory device 150 may be integrated into one semiconductor device. For instance, the controller 130 and the memory device 150 may be integrated into one semiconductor device and configure a solid state drive (SSD). When the memory system 110 is used as an SSD, the operation speed of the host 102, which is electrically coupled with the memory system 110 may be significantly increased.

The controller 130 and the memory device 150 may be integrated into one semiconductor device and configure a memory card. The controller 130 and the memory card 150 may be integrated into one semiconductor device and configure a memory card such as a Personal Computer Memory Card International Association (PCMCIA) card, a compact flash (CF) card, a smart media (SM) card, a memory stick, a multimedia card (MMC), an RS-MMC and a micro-MMC, a secure digital (SD) card, a mini-SD, a micro-SD and an SDHC, and a universal flash storage (UFS) device.

For another instance, the memory system 110 may configure a computer, an ultra mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a three-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, an RFID device, or one of various component elements configuring a computing system.

The memory device 150 of the memory system 110 may retain stored data when power supply is interrupted and, in particular, store the data provided from the host 102 during a write operation, and provide stored data to the host 102 during a read operation. The memory device 150 may include a plurality of memory blocks 152, 154 and 156. Each of the memory blocks 152, 154 and 156 may include a plurality of pages. Each of the pages may include a plurality of memory cells to which a plurality of word lines (WL) are electrically coupled. The memory device 150 may be a nonvolatile memory device, for example, a flash memory. The flash memory may have a three-dimensional (3D) stack structure. The structure of the memory device 150 and the three-dimensional (3D) stack structure of the memory device 150 will be described later in detail with reference to FIGS. 2 to 11.

The controller 130 of the memory system 110 may control the memory device 150 in response to a request from the host 102. The controller 130 may provide the data read from the memory device 150, to the host 102, and store the data provided from the host 102 into the memory device 150. To this end, the controller 130 may control overall operations of the memory device 150, such as read, write, program and erase operations.

In detail, the controller 130 may include a host interface unit 132, a processor 134, an error correction code (ECC) unit 138, a power management unit 140, a NAND flash controller 142, and a memory 144.

The host interface unit 132 may process commands and data provided from the host 102, and may communicate with the host 102 through at least one of various interface protocols such as a universal serial bus (USB), a multimedia card (MMC), a peripheral component interconnect-express (PCI-E), a serial-attached SCSI (SAS), a serial advanced technology attachment (SATA), a parallel advanced technology attachment (PATA), a small computer system interface (SCSI), an enhanced small disk interface (ESDI), and an integrated drive electronics (IDE).

The ECC unit 138 may detect and correct an error included in the data read from the memory device 150 during the read operation. The ECC unit 138 may not correct error bits when the number of the error bits is greater than or equal to a threshold number of correctable error bits, and may output an error correction fail signal indicating failure in correcting the error bits.

The ECC unit 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC unit 138 may include all circuits, systems or devices for the error correction operation.

The NFC 142 may serve as a memory interface between the controller 130 and the memory device 150 to allow the controller 130 to control the memory device 150 in response to a request from the host 102. The NFC 142 may generate control signals for the memory device 150 and process data under the control of the processor 134 when the memory device 150 is a flash memory and, in particular, when the memory device 150 is a NAND flash memory.

The memory 144 may serve as a working memory of the memory system 110 and the controller 130, and store data for driving the memory system 110 and the controller 130. The controller 130 may control the memory device 150 in response to a request from the host 102. For example, the controller 130 may provide the data read from the memory device 150 to the host 102 and store the data provided from the host 102 in the memory device 150. When the controller 130 controls the operations of the memory device 150, the memory 144 may store data used by the controller 130 and the memory device 150 for such operations as read, write, program and erase operations.

The memory 144 may be implemented with volatile memory. The memory 144 may be implemented with a static random access memory (SRAM) or a dynamic random access memory (DRAM). As described above, the memory 144 may store data used by the host 102 and the memory device 150 for the read and write operations. To store the data, the memory 144 may include a program memory, a data memory, a write buffer, a read buffer, a map buffer, and so forth.

The processor 134 may control general operations of the memory system 110, and a write operation or a read operation for the memory device 150 in response to a write request or a read request from the host 102. The processor 134 may drive firmware, which is referred to as a flash translation layer (FTL), to control the general operations of the memory system 110. The processor 134 may be implemented with a microprocessor or a central processing unit (CPU).

A management unit (not shown) may be included in the processor 134, and may perform bad block management of the memory device 150. The management unit may find bad memory blocks included in the memory device 150, which are in unsatisfactory condition for further use, and perform bad block management on the bad memory blocks. When the memory device 150 is a flash memory, for example, a NAND flash memory, a program failure may occur during the write operation, for example, during the program operation, due to characteristics of a NAND logic function. During the bad block management, the data of the program-failed memory block or the bad memory block may be programmed into a new memory block.

Figure 2:
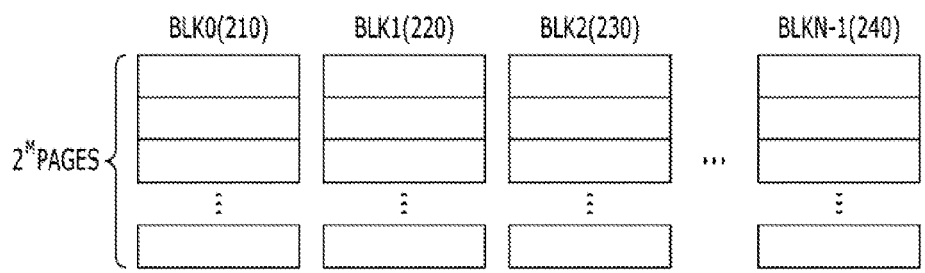
FIG. 2 is a schematic diagram illustrating a memory device shown in FIG. 1.

FIG. 2 is a schematic diagram illustrating the memory device 150 shown in FIG. 1.

Referring to FIG. 2, the memory device 150 may include a plurality of memory blocks, for example, zeroth to $(N-1)^{th}$ blocks 210 to 240. Each of the plurality of memory blocks 210 to 240 may include a plurality of pages, for example, $2^M$ number of pages ($2^M$ PAGES), to which the present invention will not be limited. Each of the plurality of pages may include a plurality of memory cells to which a plurality of word lines are electrically coupled.

Also, the memory device 150 may include a plurality of memory blocks, as single level cell (SLC) memory blocks and multi-level cell (MLC) memory blocks, according to the number of bits which may be stored or expressed in each memory cell. The SLC memory block may include a plurality of pages which are implemented with memory cells each capable of storing 1-bit data. The MLC memory block may include a plurality of pages which are implemented with memory cells each capable of storing multi-bit data, for example, two or more-bit data. An MLC memory block including a plurality of pages which are implemented with memory cells that are each capable of storing 3-bit data may be defined as a triple level cell (TLC) memory block.

Each of the plurality of memory blocks 210 to 240 may store the data provided from the host device 102 during a write operation, and may provide stored data to the host 102 during a read operation.

Figure 3:
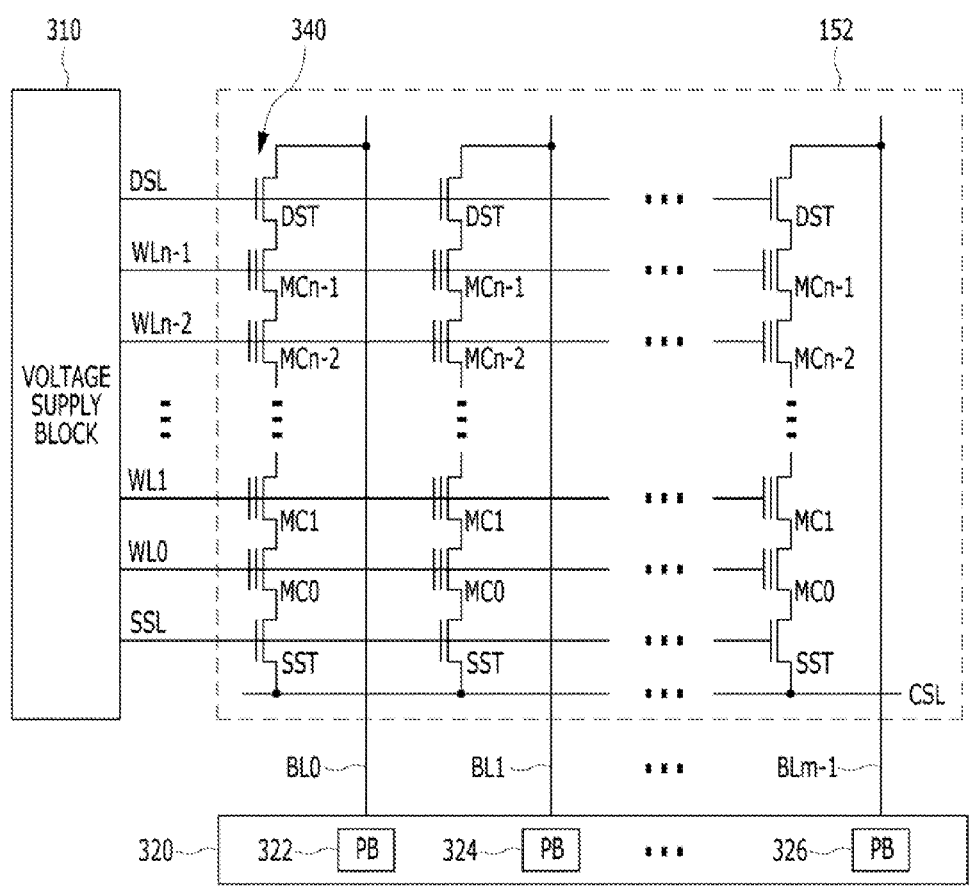
FIG. 3 is a circuit diagram illustrating a memory block shown in FIG. 1.

FIG. 3 is a circuit diagram illustrating one of the plurality of memory blocks 152 to 156 shown in FIG. 1.

Referring to FIG. 3, the memory block 152 of the memory device 150 may include a plurality of cell strings 340 which are electrically coupled to bit lines BL0 to BLm-1, respectively. The cell string 340 of each column may include at least one drain select transistor DST and at least one source select transistor SST. A plurality of memory cells or a plurality of memory cell transistors MC0 to MCn-1 may be electrically coupled in series between the select transistors DST and SST. The respective memory cells MC0 to MCn-1 may be configured by multi-level cells (MLC) each of which stores data information of a plurality of bits. The strings 340 may be electrically coupled to the corresponding bit lines BL0 to BLm-1, respectively. For reference, in FIG. 3, 'DSL' denotes a drain select line, 'SSL' denotes a source select line, and 'CSL' denotes a common source line.

While FIG. 3 shows, as an example, the memory block 152 which is configured by NAND flash memory cells, it is to be noted that the memory block 152 of the memory device 150 in accordance with the embodiment is not limited to NAND flash memory and may be realized by NOR flash memory, hybrid flash memory in which at least two kinds of memory cells are combined, or one-NAND flash memory in which a controller is built in a memory chip. The operational characteristics of a semiconductor device may be applied to not only a flash memory device in which a charge storing layer is configured by conductive floating gates but also a charge trap flash (CTF) in which a charge storing layer is configured by a dielectric layer.

A voltage supply block 310 of the memory device 150 may provide word line voltages, for example, a program voltage, a read voltage and a pass voltage, to be supplied to respective word lines according to an operation mode and voltages to be supplied to bulks, for example, well regions in which the memory cells are formed. The voltage supply block 310 may perform a voltage generating operation under the control of a control circuit (not shown). The voltage supply block 310 may generate a plurality of variable read voltages to generate a plurality of read data, select one of the memory blocks or sectors of a memory cell array under the control of the control circuit, select one of the word lines of the selected memory block, and provide the word line voltages to the selected word line and unselected word lines.

A read/write circuit 320 of the memory device 150 may be controlled by the control circuit, and may serve as a sense amplifier or a write driver according to an operation mode.

During a verification/normal read operation, the read/write circuit 320 may serve as a sense amplifier for reading data from the memory cell array. Also, during a program operation, the read/write circuit 320 may serve as a write driver which drives bit lines according to data to be stored in the memory cell array. The read/write circuit 320 may receive data to be written in the memory cell array, from a buffer (not shown), during the program operation, and may drive the bit lines according to the inputted data. To this end, the read/write circuit 320 may include a plurality of page buffers 322, 324 and 326 respectively corresponding to columns (or bit lines) or pairs of columns (or pairs of bit lines), and a plurality of latches (not shown) may be included in each of the page buffers 322, 324 and 326.

FIGS. 4 to 11 are schematic diagrams illustrating the memory device 150 shown in FIG. 1.

Figure 4:
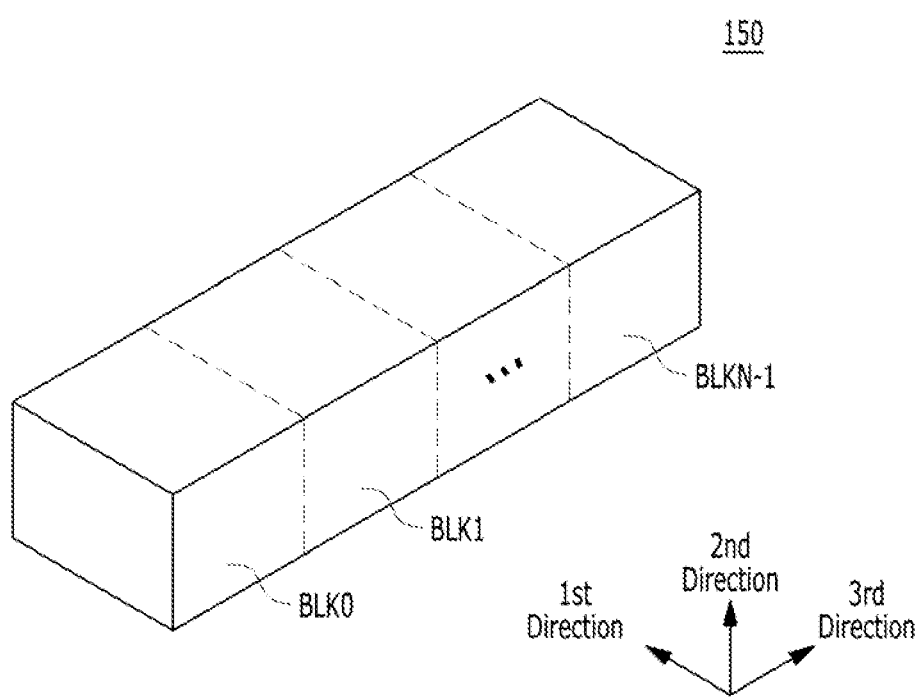
FIGS. 4 to 11 are schematic diagrams illustrating a memory device shown in FIG. 1.

FIG. 4 is a block diagram illustrating an example of the plurality of memory blocks 152 to 156 of the memory device 150 shown in FIG. 1.

Referring to FIG. 4, the memory device 150 may include a plurality of memory blocks BLK0 to BLKN−1, and each of the memory blocks BLK0 to BLKN−1 may be realized in a three-dimensional (3D) structure or a vertical structure. The respective memory blocks BLK0 to BLKN−1 may include structures which extend in first to third directions, for example, an x-axis direction, a y-axis direction and a z-axis direction.

The respective memory blocks BLK0 to BLKN−1 may include a plurality of NAND strings NS which extend in the second direction. The plurality of NAND strings NS may be provided in the first direction and the third direction. Each NAND string NS may be electrically coupled to a bit line BL, at least one source select line SSL, at least one ground select line GSL, a plurality of word lines WL, at least one dummy word line DWL, and a common source line CSL. Namely, the respective memory blocks BLK0 to BLKN−1 may be electrically coupled to a plurality of bit lines BL, a plurality of source select lines SSL, a plurality of ground select lines GSL, a plurality of word lines WL, a plurality of dummy word lines DWL, and a plurality of common source lines CSL.

Figure 5:
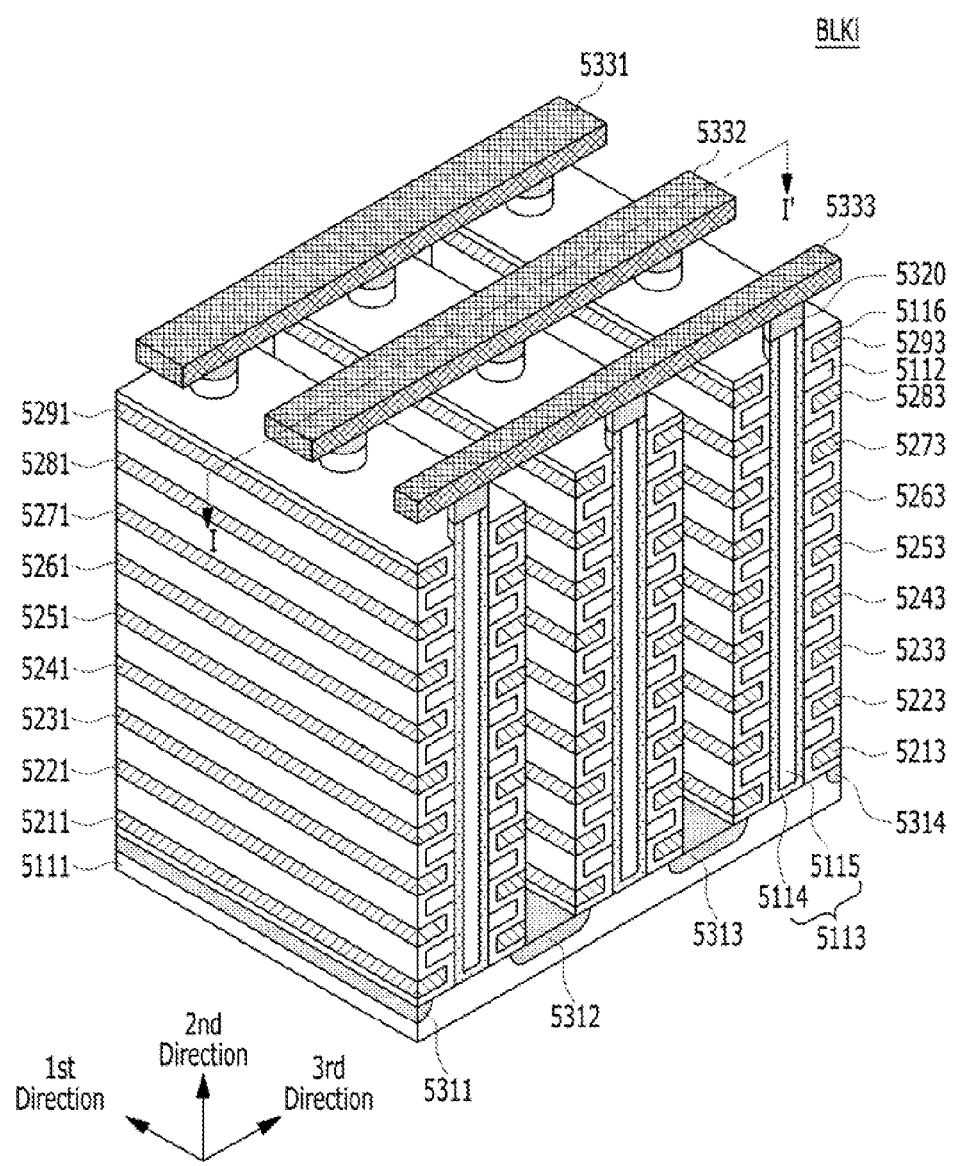
Figure 6:
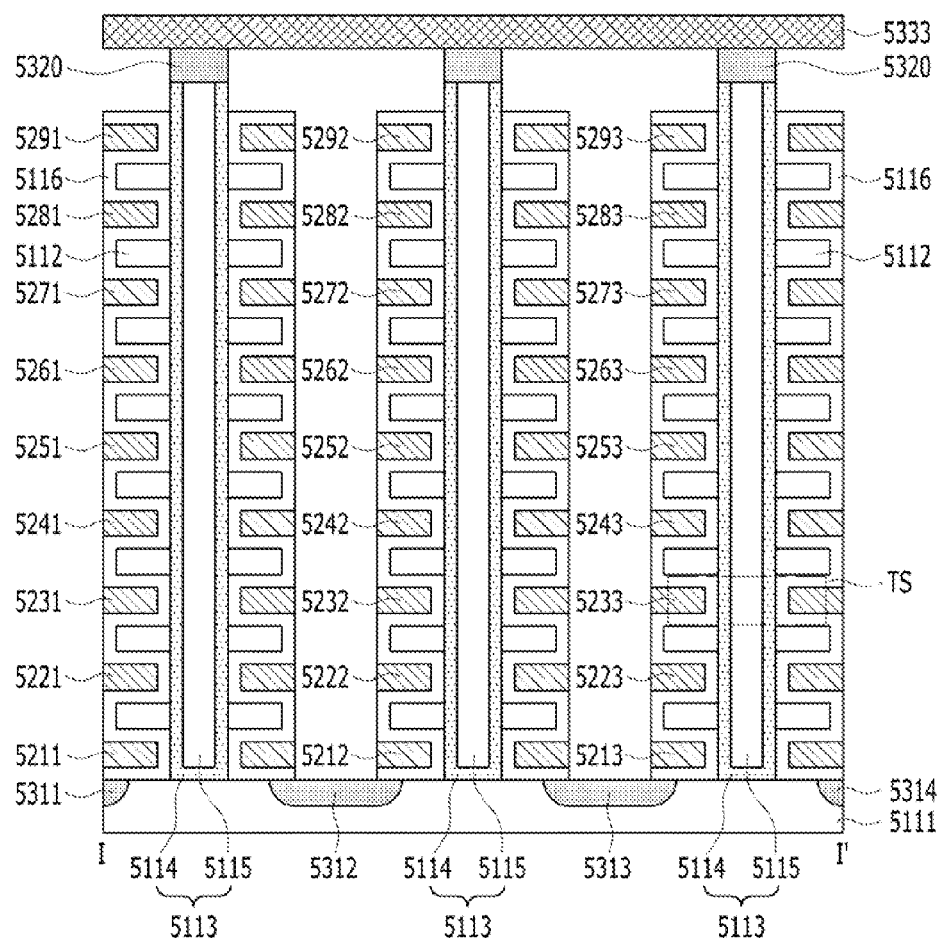

FIG. 5 is a perspective view of one BLKi of the plural memory blocks BLK0 to BLKN−1 shown in FIG. 4. FIG. 6 is a cross-sectional view taken along a line I-I' of the memory block BLKi shown in FIG. 5.

Referring to FIGS. 5 and 6, the certain memory block BLKi among the plurality of memory blocks of the memory device 150 may include a structure which extends in the first to third directions.

A substrate 5111 may be provided. The substrate 5111 may include a silicon material doped with a first type impurity. The substrate 5111 may include a silicon material doped with a p-type impurity or may be a p-type well, for example, a pocket p-well, and include an n-type well which surrounds the p-type well. While it is assumed in the embodiment for the sake of convenience in explanation that the substrate 5111 is p-type silicon, it is to be noted that the substrate 5111 is not limited to being p-type silicon.

A plurality of doping regions 5311 to 5314 which extend in the first direction may be provided over the substrate 5111. The plurality of doping regions 5311 to 5314 may contain a second type of impurity that is different from the substrate 5111. The plurality of doping regions 5311 to 5314 may be doped with an n-type impurity. While it is assumed here that first to fourth doping regions 5311 to 5314 are n-type, it is to be noted that the first to fourth doping regions 5311 to 5314 are not limited to being n-type.

In the region over the substrate 5111 between the first and second doping regions 5311 and 5312, a plurality of dielectric materials 5112 which extend in the first direction may be sequentially provided in the second direction. The dielectric materials 5112 and the substrate 5111 may be separated from one another by a predetermined distance in the second direction. The dielectric materials 5112 may be separated from one another by a predetermined distance in the second direction. The dielectric materials 5112 may include a dielectric material such as silicon oxide.

In the region over the substrate 5111 between the first and second doping regions 5311 and 5312, a plurality of pillars 5113 which are sequentially disposed in the first direction and pass through the dielectric materials 5112 in the second direction may be provided. The plurality of pillars 5113 may respectively pass through the dielectric materials 5112 and may be electrically coupled with the substrate 5111. Each pillar 5113 may be configured by a plurality of materials. The surface layer 5114 of each pillar 5113 may include a silicon material doped with the first type of impurity. The surface layer 5114 of each pillar 5113 may include a silicon material doped with the same type of impurity as the substrate 5111. While it is assumed here that the surface layer 5114 of each pillar 5113 may include p-type silicon, it is to be noted that the surface layer 5114 of each pillar 5113 is not limited to being p-type silicon.

An inner layer 5115 of each pillar 5113 may be formed of a dielectric material. The inner layer 5115 of each pillar 5113 may be filled by a dielectric material such as silicon oxide.

In the region between the first and second doping regions 5311 and 5312, a dielectric layer 5116 may be provided along the exposed surfaces of the dielectric materials 5112, the pillars 5113 and the substrate 5111. The thickness of the dielectric layer 5116 may be less than half of the distance between the dielectric materials 5112. In other words, a region in which a material other than the dielectric material 5112 and the dielectric layer 5116 may be disposed, may be provided between (i) the dielectric layer 5116 provided over the bottom surface of a first dielectric material of the dielectric materials 5112 and (ii) the dielectric layer 5116 provided over the top surface of a second dielectric material of the dielectric materials 5112. The dielectric materials 5112 lie below the first dielectric material.

In the region between the first and second doping regions 5311 and 5312, conductive materials 5211 to 5291 may be provided over the exposed surface of the dielectric layer 5116. The conductive material 5211 which extends in the first direction may be provided between the dielectric material 5112 adjacent to the substrate 5111 and the substrate 5111. In particular, the conductive material 5211 which extends in the first direction may be provided between (i) the dielectric layer 5116 disposed over the substrate 5111 and (ii) the dielectric layer 5116 disposed over the bottom surface of the dielectric material 5112 adjacent to the substrate 5111.

The conductive material which extends in the first direction may be provided between (i) the dielectric layer 5116 disposed over the top surface of a certain dielectric material of the dielectric materials 5112 and (ii) the dielectric layer 5116 disposed over the bottom surface of another dielectric material of the dielectric materials 5112, which is disposed over the certain dielectric material 5112. The conductive materials 5221 to 5281 which extend in the first direction may be provided between the dielectric materials 5112. The conductive material 5291 which extends in the first direction may be provided over the uppermost dielectric material 5112. The conductive materials 5211 to 5291 which extend in the first direction may be a metallic material. The conductive materials 5211 to 5291 which extend in the first direction may be a conductive material such as polysilicon.

In the region between the second and third doping regions 5312 and 5313, the same structures as the structures between the first and second doping regions 5311 and 5312 may be provided. For example, in the region between the second and third doping regions 5312 and 5313, the plurality of dielectric materials 5112 which extend in the first direction, the plurality of pillars 5113 which are sequentially arranged in the first direction and pass through the plurality of dielectric materials 5112 in the second direction, the dielectric layer 5116 which is provided over the exposed surfaces of the plurality of dielectric materials 5112 and the plurality of pillars 5113, and the plurality of conductive materials 5212 to 5292 which extend in the first direction may be provided.

In the region between the third and fourth doping regions 5313 and 5314, the same structures as between the first and second doping regions 5311 and 5312 may be provided. For example, in the region between the third and fourth doping regions 5313 and 5314, the plurality of dielectric materials 5112 which extend in the first direction, the plurality of pillars 5113 which are sequentially arranged in the first direction and pass through the plurality of dielectric materials 5112 in the second direction, the dielectric layer 5116 which is provided over the exposed surfaces of the plurality of dielectric materials 5112 and the plurality of pillars 5113, and the plurality of conductive materials 5213 to 5293 which extend in the first direction may be provided.

Drains 5320 may be respectively provided over the plurality of pillars 5113. The drains 5320 may be silicon materials doped with second type impurities. The drains 5320 may be silicon materials doped with n-type impurities. While it is assumed for the sake of convenience that the drains 5320 include n-type silicon, it is to be noted that the drains 5320 are not limited to being n-type silicon. For example, the width of each drain 5320 may be larger than the width of each corresponding pillar 5113. Each drain 5320 may be provided in the shape of a pad over the top surface of each corresponding pillar 5113.

Conductive materials 5331 to 5333 which extend in the third direction may be provided over the drains 5320. The conductive materials 5331 to 5333 may be sequentially disposed in the first direction. The respective conductive materials 5331 to 5333 may be electrically coupled with the drains 5320 of corresponding regions. The drains 5320 and the conductive materials 5331 to 5333 which extend in the third direction may be electrically coupled with through contact plugs. The conductive materials 5331 to 5333 which extend in the third direction may be a metallic material. The conductive materials 5331 to 5333 which extend in the third direction may be a conductive material such as polysilicon.

In FIGS. 5 and 6, the respective pillars 5113 may form strings together with the dielectric layer 5116 and the conductive materials 5211 to 5291, 5212 to 5292 and 5213 to 5293 which extend in the first direction. The respective pillars 5113 may form NAND strings NS together with the dielectric layer 5116 and the conductive materials 5211 to 5291, 5212 to 5292 and 5213 to 5293 which extend in the first direction. Each NAND string NS may include a plurality of transistor structures TS.

Figure 7:
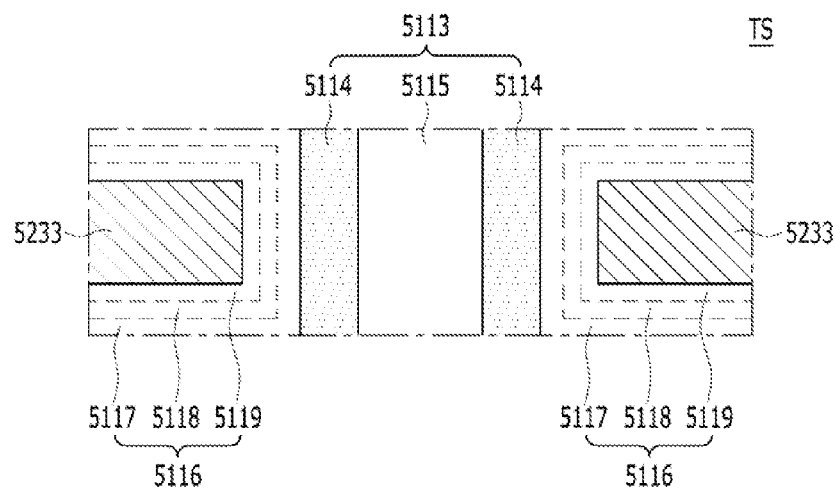

FIG. 7 is a cross-sectional view of the transistor structure TS shown in FIG. 6.

Referring to FIG. 7, in the transistor structure TS shown in FIG. 6, the dielectric layer 5116 may include first to third sub dielectric layers 5117, 5118 and 5119.

The surface layer 5114 of p-type silicon in each of the pillars 5113 may serve as a body. The first sub dielectric layer 5117 adjacent to the pillar 5113 may serve as a tunneling dielectric layer, and may include a thermal oxidation layer.

The second sub dielectric layer 5118 may serve as a charge storing layer. The second sub dielectric layer 5118 may serve as a charge capturing layer, and may include a nitride layer or a metal oxide layer such as an aluminum oxide layer, a hafnium oxide layer, or the like.

The third sub dielectric layer 5119 adjacent to the conductive material 5233 may serve as a blocking dielectric layer. The third sub dielectric layer 5119 adjacent to the conductive material 5233 which extends in the first direction may be formed as a single layer or multiple layers. The third sub dielectric layer 5119 may be a high-k dielectric layer such as an aluminum oxide layer, a hafnium oxide layer, or the like, which has a dielectric constant greater than the first and second sub dielectric layers 5117 and 5118.

The conductive material 5233 may serve as a gate or a control gate. That is, the gate or the control gate 5233, the blocking dielectric layer 5119, the charge storing layer 5118, the tunneling dielectric layer 5117 and the body 5114 may form a transistor or a memory cell transistor structure. For example, the first to third sub dielectric layers 5117 to 5119 may form an oxide-nitride-oxide (ONO) structure. In the embodiment, for the sake of convenience in explanation, the surface layer 5114 of p-type silicon in each of the pillars 5113 will be referred to as a body in the second direction.

The memory block BLKi may include the plurality of pillars 5113. Namely, the memory block BLKi may include the plurality of NAND strings NS. In detail, the memory block BLKi may include the plurality of NAND strings NS which extend in the second direction or a direction perpendicular to the substrate 5111.

Each NAND string NS may include the plurality of transistor structures TS which are disposed in the second direction. At least one of the plurality of transistor structures TS of each NAND string NS may serve as a source select transistor SST. At least one of the plurality of transistor structures TS of each NAND string NS may serve as a ground select transistor GST.

The gates or control gates may correspond to the conductive materials 5211 to 5291, 5212 to 5292 and 5213 to 5293 which extend in the first direction. In other words, the gates or the control gates may extend in the first direction and form word lines and at least two select lines, at least one source select line SSL and at least one ground select line GSL.

The conductive materials 5331 to 5333 which extend in the third direction may be electrically coupled to one end of the NAND strings NS. The conductive materials 5331 to 5333 which extend in the third direction may serve as bit lines BL. That is, in one memory block BLKi, the plurality of NAND strings NS may be electrically coupled to one bit line BL.

The second type doping regions 5311 to 5314 which extend in the first direction may be provided to the other ends of the NAND strings NS. The second type doping regions 5311 to 5314 which extend in the first direction may serve as common source lines CSL.

Namely, the memory block BLKi may include a plurality of NAND strings NS which extend in a direction perpendicular to the substrate 5111, e.g., the second direction, and may serve as a NAND flash memory block, for example, of a charge capturing type memory, in which a plurality of NAND strings NS are electrically coupled to one bit line BL.

While it is illustrated in FIGS. 5 to 7 that the conductive materials 5211 to 5291, 5212 to 5292 and 5213 to 5293 which extend in the first direction are provided in 9 layers, it is to be noted that the conductive materials 5211 to 5291, 5212 to 5292 and 5213 to 5293 which extend in the first direction are not limited to being provided in 9 layers. For example, conductive materials which extend in the first direction may be provided in 8 layers, 16 layers or any multiple of layers. In other words, in one NAND string NS, the number of transistors may be 8, 16 or more.

While it is illustrated in FIGS. 5 to 7 that 3 NAND strings NS are electrically coupled to one bit line BL, it is to be noted that the embodiment is not limited to having 3 NAND strings NS are electrically coupled to one bit line BL. In the memory block BLKi, m number of NAND strings NS may be electrically coupled to one bit line BL, m being a positive integer. According to the number of NAND strings NS which are electrically coupled to one bit line BL, the number of conductive materials 5211 to 5291, 5212 to 5292 and 5213 to 5293 which extend in the first direction and the number of common source lines 5311 to 5314 may be controlled as well.

Further, while it is illustrated in FIGS. 5 to 7 that 3 NAND strings NS are electrically coupled to one conductive material which extends in the first direction, it is to be noted that the embodiment is not limited to having 3 NAND strings NS electrically coupled to one conductive material which extends in the first direction. For example, n number of NAND strings NS may be electrically coupled to one conductive material which extends in the first direction, n being a positive integer. According to the number of NAND strings NS which are electrically coupled to one conductive material which extends in the first direction, the number of bit lines 5331 to 5333 may be controlled as well.

Figure 8:
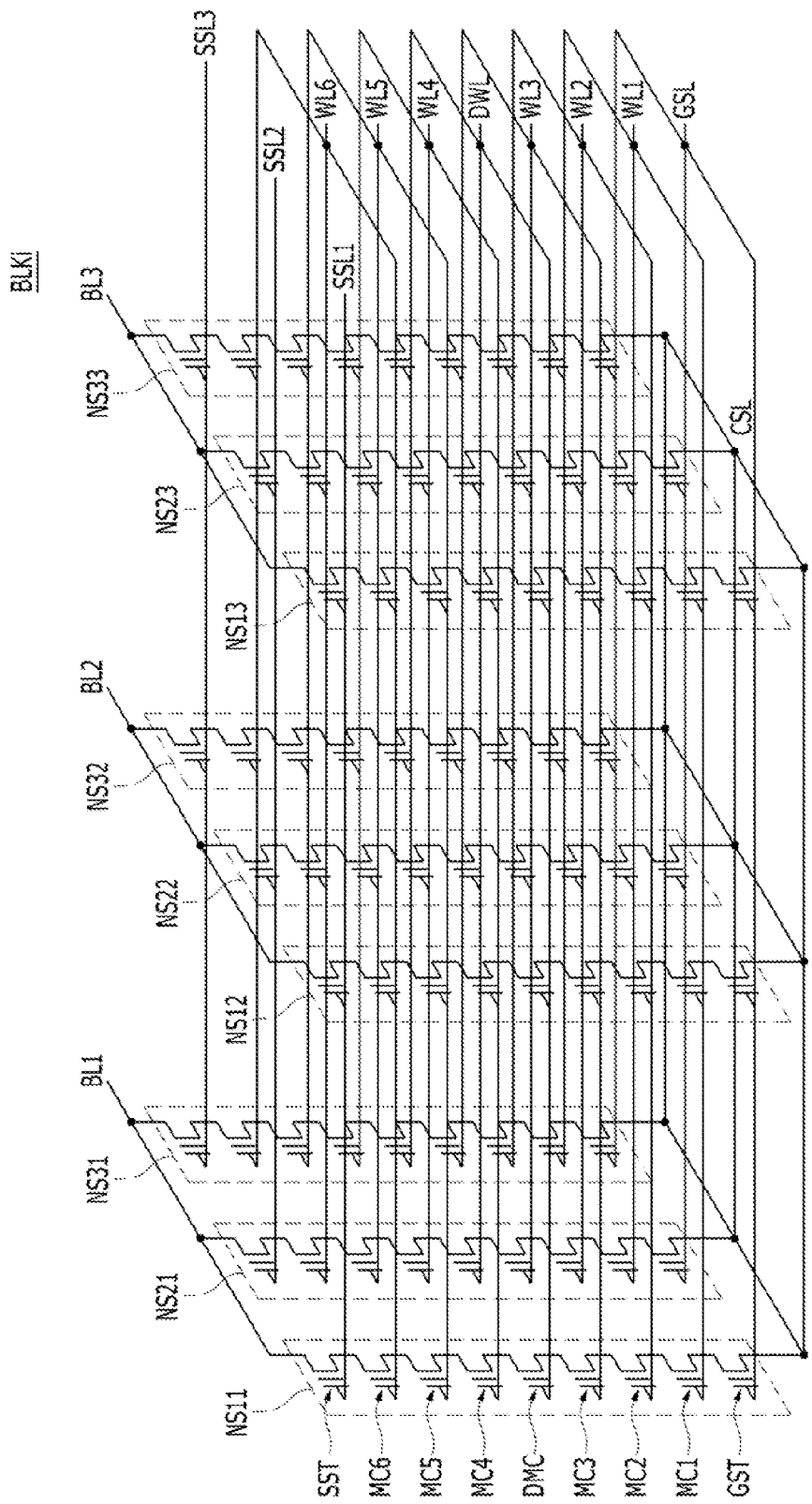

FIG. 8 is an equivalent circuit diagram illustrating the memory block BLKi having a first structure described with reference to FIGS. 5 to 7.

Referring to FIG. 8, in the certain block BLKi having the first structure, NAND strings NS11 to NS31 may be provided between a first bit line BL1 and a common source line CSL. The first bit line BL1 may correspond to the conductive material 5331 of FIGS. 5 and 6, which extends in the third direction. NAND strings NS12 to NS32 may be provided between a second bit line BL2 and the common source line CSL. The second bit line BL2 may correspond to the conductive material 5332 of FIGS. 5 and 6, which extends in the third direction. NAND strings NS13 to NS33 may be provided between a third bit line BL3 and the common source line CSL. The third bit line BL3 may correspond to the conductive material 5333 of FIGS. 5 and 6, which extends in the third direction.

A source select transistor SST of each NAND string NS may be electrically coupled to a corresponding bit line BL. A ground select transistor GST of each NAND string NS may be electrically coupled to the common source line CSL. Memory cells MC may be provided between the source select transistor SST and the ground select transistor GST of each NAND string NS.

In this example, NAND strings NS may be defined by the unit of row and column and NAND strings NS which are electrically coupled to one bit line may form one column. The NAND strings NS11 to NS31 which are electrically coupled to the first bit line BL1 may correspond to a first column, the NAND strings NS12 to NS32 which are electrically coupled to the second bit line BL2 may correspond to a second column, and the NAND strings NS13 to NS33 which are electrically coupled to the third bit line BL3 may correspond to a third column. NAND strings NS which are electrically coupled to one source select line SSL may form one row. The NAND strings NS11 to NS13 which are electrically coupled to a first source select line SSL1 may form a first row, the NAND strings NS21 to NS23 which are electrically coupled to a second source select line SSL2 may form a second row, and the NAND strings NS31 to NS33 which are electrically coupled to a third source select line SSL3 may form a third row.

In each NAND string NS, a height may be defined. In each NAND string NS, the height of a memory cell MC1 adjacent to the ground select transistor GST is a value '1'. In each NAND string NS, the height of a memory cell may increase as the memory cell gets closer to the source select transistor SST when measured from the substrate 5111. In each NAND string NS, the height of a memory cell MC6 adjacent to the source select transistor SST is 7.

The source select transistors SST of the NAND strings NS in the same row may share the source select line SSL. The source select transistors SST of the NAND strings NS in different rows may be respectively electrically coupled to the different source select lines SSL1, SSL2 and SSL3.

The memory cells at the same height in the NAND strings NS in the same row may share a word line WL. That is, at the same height, the word lines WL electrically coupled to the memory cells MC of the NAND strings NS in different rows may be electrically coupled. Dummy memory cells DMC at the same height in the NAND strings NS of the same row may share a dummy word line DWL. Namely, at the same height or level, the dummy word lines DWL electrically coupled to the dummy memory cells DMC of the NAND strings NS in different rows may be electrically coupled with one another.

The word lines WL or the dummy word lines DWL located at the same level or height or layer may be electrically coupled at layers where the conductive materials 5211 to 5291, 5212 to 5292 and 5213 to 5293 which extend in the first direction are provided. The conductive materials 5211 to 5291, 5212 to 5292 and 5213 to 5293 which extend in the first direction may be electrically coupled to upper layers through contacts. At the upper layers, the conductive materials 5211 to 5291, 5212 to 5292 and 5213 to 5293 which extend in the first direction may be electrically coupled. In other words, the ground select transistors GST of the NAND strings NS in the same row may share the ground select line GSL. Further, the ground select transistors GST of the NAND strings NS in different rows may share the ground select line GSL. That is, the NAND strings NS 11 to NS13, NS21 to NS23 and NS31 to NS33 may be electrically coupled to the ground select line GSL.

The common source line CSL may be electrically coupled to the NAND strings NS. Over the active regions and over the substrate 5111, the first to fourth doping regions 5311 to 5314 may be electrically coupled with one another. The first to fourth doping regions 5311 to 5314 may be electrically coupled to an upper layer through contacts and, at the upper layer, the first to fourth doping regions 5311 to 5314 may be electrically coupled.

Namely, as shown in FIG. 8, the word lines WL of the same height or level may be electrically coupled. Accordingly, when a certain word line WL at a specific height is selected, all NAND strings NS which are electrically coupled to the certain word line WL may be selected. The NAND strings NS in different rows may be electrically coupled to different source select lines SSL. Accordingly, among the NAND strings NS electrically coupled to the same word line WL, by selecting one of the source select lines SSL1 to SSL3, the NAND strings NS in the unselected rows may be electrically isolated from the bit lines BL1 to BL3. In other words, by selecting one of the source select lines SSL1 to SSL3, a row of NAND strings NS may be selected. Moreover, by selecting one of the bit lines BL1 to BL3, the NAND strings NS in the selected rows may be selected in units of columns.

In each NAND string NS, a dummy memory cell DMC may be provided. In FIG. 8, the dummy memory cell DMC is provided between a third memory cell MC3 and a fourth memory cell MC4 in each NAND string NS. That is, first to third memory cells MC1 to MC3 may be provided between the dummy memory cell DMC and the ground select transistor GST. Fourth to sixth memory cells MC4 to MC6 may be provided between the dummy memory cell DMC and the source select transistor SST. The memory cells MC of each NAND string NS may be divided into memory cell groups by the dummy memory cell DMC. In the divided memory cell groups, memory cells, for example, MC1 to MC3, adjacent to the ground select transistor GST, may be referred to as a lower memory cell group, and memory cells, for example, MC4 to MC6, adjacent to the source select transistor SST, may be referred to as an upper memory cell group.

Hereinbelow, detailed descriptions will be made with reference to FIGS. 9 to 11, for when the memory device in the memory system in accordance with the embodiment is implemented with a three-dimensional (3D) nonvolatile memory device of a structure different from the first structure.

Figure 9:
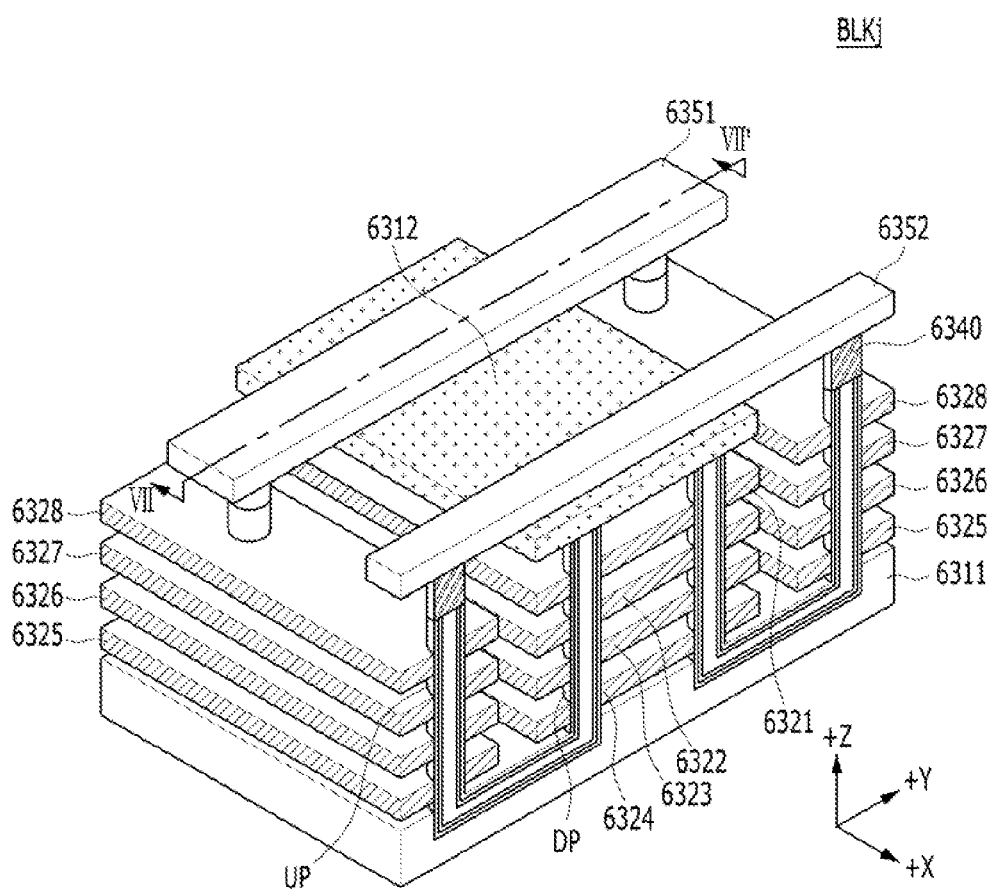
Figure 10:
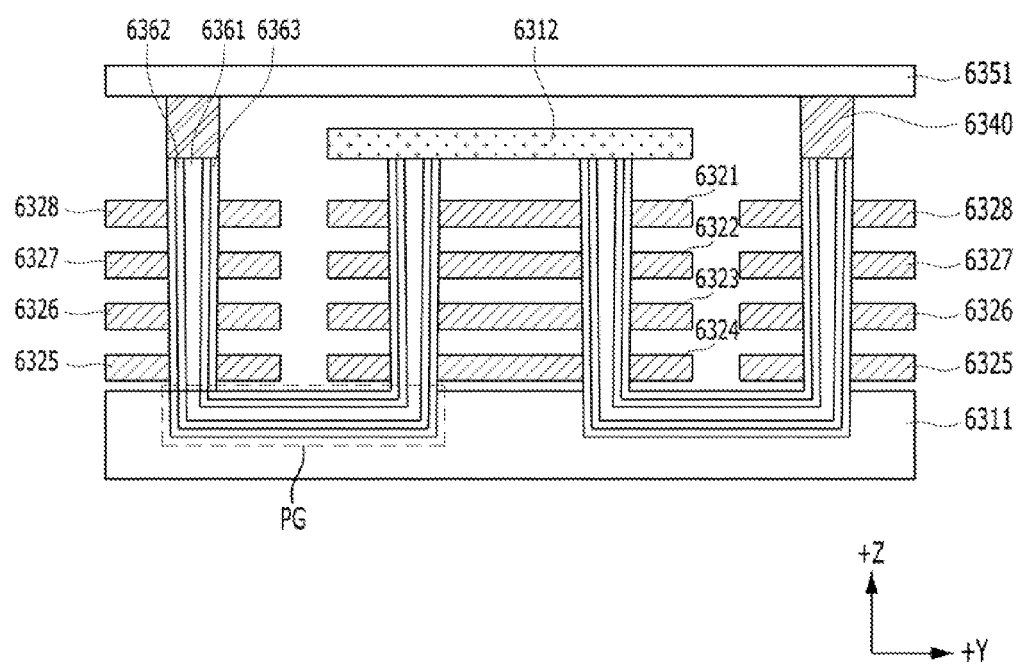

FIG. 9 is a perspective view schematically illustrating structures for when the memory device in accordance with the embodiment is implemented with a three-dimensional (3D) nonvolatile memory device of a second structure that is different from the first structure described above with reference to FIGS. 5 to 8 and showing a certain memory block BLKj having the second structure in the plurality of memory blocks of FIG. 4, and FIG. 10 is a cross-sectional view illustrating the certain memory block BLKj taken along the line VII-VII' of FIG. 9.

Referring to FIGS. 9 and 10, the certain memory block BLKj among the plurality of memory blocks of the memory device 150 of FIG. 1 may include structures which extend in the first to third directions.

A substrate 6311 may be provided. The substrate 6311 may include a silicon material doped with a first type impurity. The substrate 6311 may include a silicon material doped with a p-type impurity or may be a p-type well, for example, a pocket p-well, and include an n-type well which surrounds the p-type well. While it is assumed in the embodiment for the sake of convenience in explanation that the substrate 6311 is p-type silicon, it is to be noted that the substrate 6311 is not limited to being p-type silicon.

First to fourth conductive materials 6321 to 6324 which extend in the x-axis direction and the y-axis direction are provided over the substrate 6311. The first to fourth conductive materials 6321 to 6324 are to be separated by a predetermined distance in the z-axis direction.

Fifth to eighth conductive materials 6325 to 6328 which extend in the x-axis direction and the y-axis direction are provided over the substrate 6311. The fifth to eighth conductive materials 6325 to 6328 are separated by the predetermined distance in the z-axis direction. The fifth to eighth conductive materials 6325 to 6328 are provided to be separated from the first to fourth conductive materials 6321 to 6324 in the y-axis direction.

A plurality of lower pillars DP which pass through the first to fourth conductive materials 6321 to 6324 are provided. Each lower pillar DP extends in the z-axis direction. Also, a plurality of upper pillars UP which pass through the fifth to eighth conductive materials 6325 to 6328 are provided. Each upper pillar UP extends in the z-axis direction.

Each of the lower pillars DP and the upper pillars UP may include an internal material 6361, an intermediate layer 6362, and a surface layer 6363. The Intermediate layer 6362 serves as a channel of the cell transistor. The surface layer 6363 may include a blocking dielectric layer, a charge storing layer and a tunneling dielectric layer.

The lower pillar DP and the upper pillar UP are electrically coupled through a pipe gate PG. The pipe gate PG may be disposed in the substrate 6311. For instance, the pipe gate PG may include the same material as the lower pillar DP and the upper pillar UP.

A doping material 6312 of a second type which extends in the x-axis direction and the y-axis direction is provided over the lower pillars DP. The doping material 6312 of the second type may include an n-type silicon material. The doping material 6312 of the second type serves as a common source line CSL.

Drains 6340 are provided over the upper pillars UP. The drains 6340 may include an n-type silicon material. First and second upper conductive materials 6351 and 6352 which extend in the y-axis direction are provided over the drains 6340.

The first and second upper conductive materials 6351 and 6352 are separated in the x-axis direction. The first and second upper conductive materials 6351 and 6352 may be formed of a metal. The first and second upper conductive materials 6351 and 6352 and the drains 6340 may be electrically coupled through contact plugs. The first and second upper conductive materials 6351 and 6352 respectively serve as first and second bit lines BL1 and BL2.

The first conductive material 6321 serves as a source select line SSL, the second conductive material 6322 serves as a first dummy word line DWL1, and the third and fourth conductive materials 6323 and 6324 serve as first and second main word lines MWL1 and MWL2, respectively. The fifth and sixth conductive materials 6325 and 6326 serve as third and fourth main word lines MWL3 and MWL4, respectively, the seventh conductive material 6327 serves as a second dummy word line DWL2, and the eighth conductive material 6328 serves as a drain select line DSL.

The lower pillar DP and the first to fourth conductive materials 6321 to 6324 adjacent to the lower pillar DP form a lower string. The upper pillar UP and the fifth to eighth conductive materials 6325 to 6328 adjacent to the upper pillar UP form an upper string. The lower string and the upper string are electrically coupled through the pipe gate PG. One end of the lower string is electrically coupled to the doping material 6312 of the second type which serves as the common source line CSL. One end of the upper string is electrically coupled to a corresponding bit line through the drain 6340. One lower string and one upper string form one cell string which is electrically coupled between the doping material 6312 of the second type, serving as the common source line CSL, and a corresponding one of the upper conductive material layers 6351 and 6352, serving as the bit line BL.

That is, the lower string may include a source select transistor SST, the first dummy memory cell DMC1, and the first and second main memory cells MMC1 and MMC2. The upper string may include the third and fourth main memory cells MMC3 and MMC4, the second dummy memory cell DMC2, and a drain select transistor DST.

In FIGS. 9 and 10, the upper string and the lower string may form a NAND string NS, and the NAND string NS may include a plurality of transistor structures TS. Since the transistor structure included in the NAND string NS in FIGS. 9 and 10 is described above in detail with reference to FIG. 7, a detailed description thereof will be omitted herein.

Figure 11:
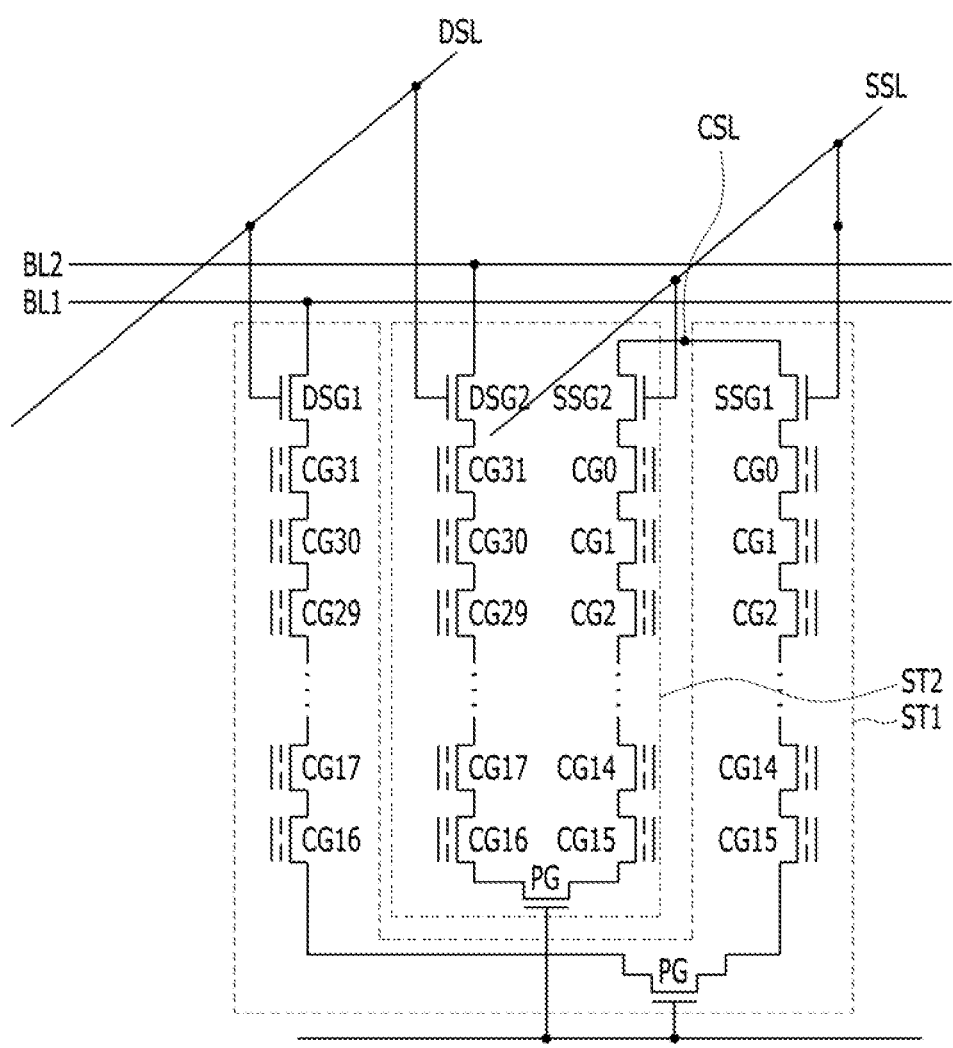

FIG. 11 is a circuit diagram illustrating the equivalent circuit of the memory block BLKj having the second structure as described above with reference to FIGS. 9 and 10. For the sake of convenience, only a first string and a second string, which form a pair in the certain memory block BLKj in the second structure, are shown.

Referring to FIG. 11, in the certain memory block BLKj having the second structure, among the plurality of blocks of the memory device 150, as described above with reference to FIGS. 9 and 10, cell strings, each of which is implemented with one upper string and one lower string are electrically coupled through the pipe gate PG, may be provided in such a way as to define a plurality of pairs.

Namely, in the certain memory block BLKj having the second structure, memory cells CG0 to CG31 stacked along a first channel CH1 (not shown), for example, at least one source select gate SSG1 and at least one drain select gate DSG1 may form a first string ST1, and memory cells CG0 to CG31 stacked along a second channel CH2 (not shown), for example, at least one source select gate SSG2 and at least one drain select gate DSG2 may form a second string ST2.

The first string ST1 and the second string ST2 are electrically coupled to the same drain select line DSL and the same source select line SSL. The first string ST1 is electrically coupled to a first bit line BL1, and the second string ST2 is electrically coupled to a second bit line BL2.

While it is described in FIG. 11 that the first string ST1 and the second string ST2 are electrically coupled to the same drain select line DSL and the same source select line SSL, it may be envisaged that the first string ST1 and the second string ST2 are electrically coupled to the same source select line SSL and the same bit line BL, the first string ST1 is electrically coupled to a first drain select line DSL1 and the second string ST2 is electrically coupled a second drain select line DSL2, or it may be envisaged that the first string ST1 and the second string ST2 are electrically coupled to the same drain select line DSL and the same bit line BL, the first string ST1 is electrically coupled to a first source select line SSL1 and the second string ST2 is electrically coupled a second source select line SSL2. Hereinbelow, an operation of processing data to a memory device in a memory system in accordance with an embodiment of the present invention, or particularly, a data program operation or data write operation will be described in detail with reference to FIGS. 12 to 14.

Figure 12:
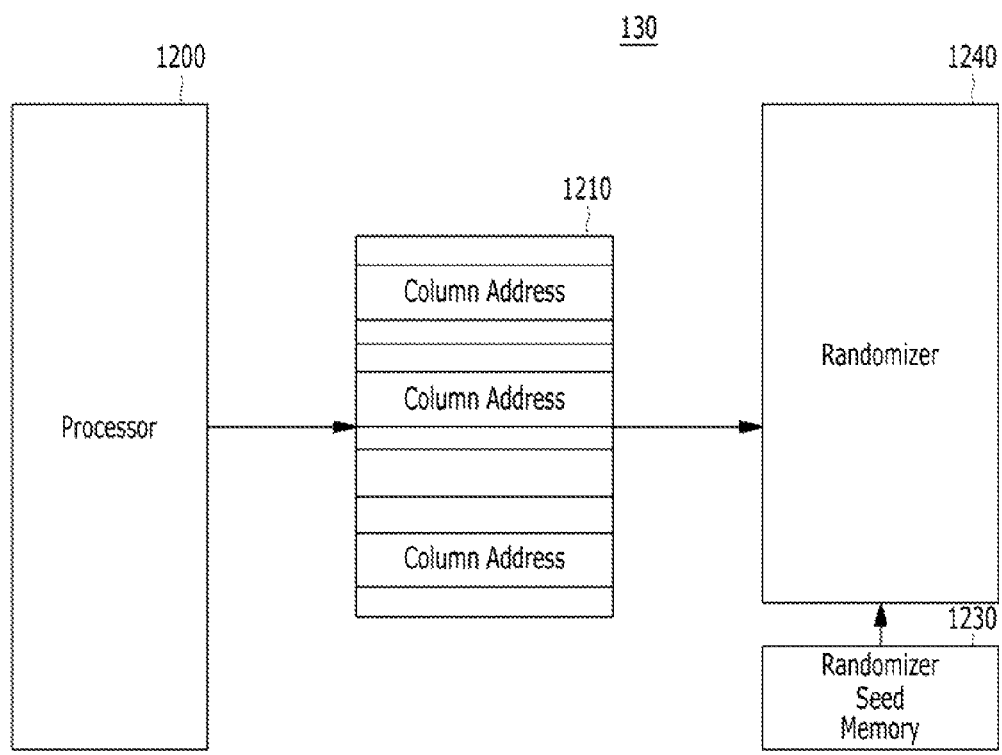
FIG. 12 is a schematic diagram illustrating a controller shown in FIG. 1.

FIG. 12 is schematic diagram illustrating the controller 130 shown in FIG. 1. FIG. 12 shows the write operation of the controller 130 as an example. During the write operation, write data corresponding to a write command received from a host 102 may be temporarily stored into a write buffer/cache included in the memory 144 of the controller 130, may be randomized, and may be written into pages of the plurality of memory blocks 152 to 156 included in the memory device 150. The write buffer/cache may be one or combination of the plurality of page buffers 322 to 326 of the memory device 150 described with reference to FIG. 3, a plurality of latches, and an external memory device.

As described above, the write data temporarily stored in the buffer/cache may be randomized through a random seed, and then written to pages of the memory blocks included in the memory device 150. The random seed may be stored in a randomizer seed memory 1230 included the controller 130. The write data may be randomized by a randomizer 1240 through the random seed. The randomizer may be included in the controller 130, or may be implemented separately from the controller 130.

Referring to FIG. 12, when receiving a write command and corresponding write data from the host 102, the controller 130 may temporarily store the write data into a buffer 1210 included in the controller 130, randomize the temporarily stored write data through the randomizer 1240 using the random seed, and write the randomized write data to the plurality of pages included in the plurality of memory blocks.

Based on the random seed, a program location or seed offset in the pages of the memory blocks may be determined. The write data may be written at the randomized program location in the pages according to the seed offset.

In accordance with an embodiment of the present invention, during the write operation for example, the controller 130 may check size of a restricted region among the pages of the memory blocks. In the restricted region, data may not be stored. The restricted region may include an unused region, a spare region, a remaining region, and a reserved region, which are not used for storing user data.

During the write operation according to a page address, the controller 130 may compare size of the write data temporarily stored in the buffer with size of the corresponding page to which the write data are programmed according to the page address, and check the size of the restricted region of the page.

The controller 130 may set the seed offset according to the size of the restricted region, and randomize the write data through the seed offset according to a program/erase cycle (P/E cycle) or erase/write cycle (E/W cycle) for the restricted region. The controller 130 may shift column addresses in the restricted region based on the seed offset at each P/E cycle or E/W cycle, and write the write data into the page of the restricted region according to the shifted column address. Accordingly, the write data may be randomized due to the column address shifted by the seed offset and the E/W cycle.

Therefore, the memory system in accordance with the embodiment of the present invention may set the seed offset based on the size of the restricted region without changing the random seed, and then program write data according to the set seed offset while shifting the column addresses within the restricted region at each P/E cycle or E/W cycle. In accordance with an exemplary embodiment of the present invention, it is possible to obtain the same randomizing effect as changing of the random seed to write the write data into a page of the restricted region. Thus, deterioration of memory cells may be prevented, and thus the write data may be stably stored. Furthermore, since the random seed or a randomizer seed pool does not need to be changed, the complexity and degradation in performance of the memory system can be minimized.

Figure 13:
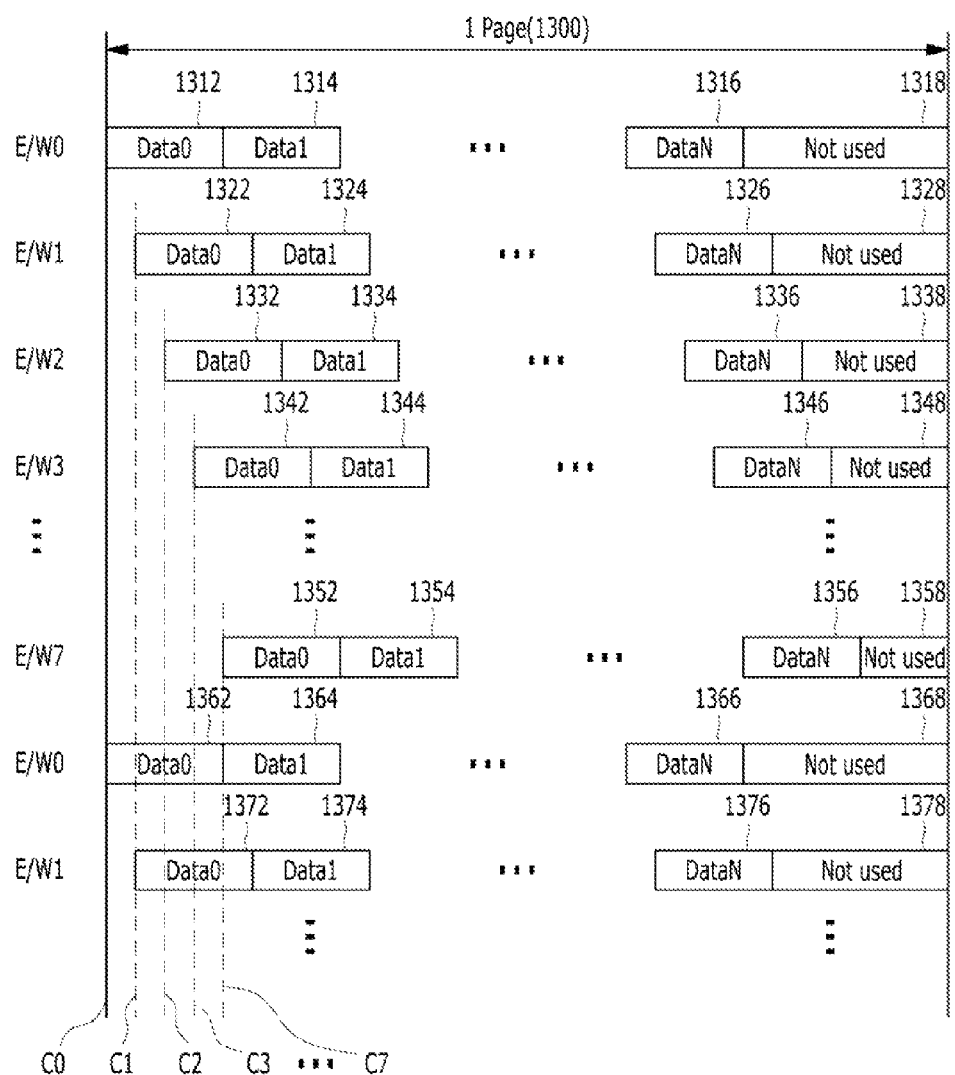
FIG. 13 is a schematic diagram illustrating an operation of a controller in accordance with an embodiment of the present invention.

FIG. 13 is a schematic diagram illustrating the operation of the controller 130 in accordance with an embodiment of the present invention. FIG. 13 also shows the write operation of the controller 130 as an example.

During the write operation to a single page 1300 among the plurality of pages, the controller 130 may check the size of the restricted region 1318. Hereafter, an initial restricted region 1318 of 12 bytes will be taken as an example.

The controller 130 may next set the seed offset based on the checked size (12 byte for example) of the restricted region 1318. In accordance with an exemplary embodiment of the present invention, the seed offset may include a shift unit and a maximum shift. The shift unit may represent a shift amount of a column address for the write data within the size of the restricted region at each E/W cycle. The maximum shift may represent the maximum shift amount of the column address for the write data within the size of the restricted region during the write operation. When the shift amount reaches the maximum shift while shifting the column address for the write data in the page 1300 by the amount of the shift unit at each E/W cycle, the offset may be initialized at the next E/W cycle. For example, the controller 130 may set the shift unit to a single byte and set the maximum shift to 7 bytes within the size (12 bytes) of the restricted region 1318.

The shift amount of the column address in the restricted region for the write data or the randomized program location may be determined by the seed offset. Therefore, the controller 130 may randomize the write data by shifting the column address in the page 1300 of the restricted region for the write data according to the shift amount determined by the seed offset, and write the randomized write data at the randomized program location in the page 1300 of the restricted region according to the shifted column address. That is, the controller 130 may randomize the write data by shifting the column address of the page 1300 of the restricted region for the write data at each E/W cycle according the shift amount of the column address determined by the seed offset. When the shift amount reaches the maximum shift while shifting the column address in the page 1300 of the restricted region for the write data by the amount of the shift unit at each E/W cycle, the controller 130 may initialize the offset at the next E/W cycle.

Referring to FIGS. 1 and 13, the controller 130 may initially write the write data Data0 to DataN 1312 to 1316 into a region starting from location C0 corresponding to an initial column address of the page 1300 at a first E/W cycle E/W0. At this time, the restricted region 1318 of the page 1300 may be set to 12 bytes, for example. At the next E/W cycle or a second E/W cycle E/W1, the controller 130 may write another write data Data0 to DataN 1322 to 1326 into a region starting from location C1 of the page 1300 corresponding to the second column address, which is shifted from the initial column address by the amount of the shift unit, for example, a single byte.

As such, at each of third to eighth E/W cycles E/W2 to E/W7, the controller 130 may write another write data Data0 to DataN into regions of the page 1300 starting from the locations C2 to C7 corresponding to the column addresses, which are shifted from the previous column address by the amount of the shift unit, respectively, as shown in FIG. 13.

When the shift amount at the eighth E/W cycle E/W7 reaches the maximum shift, namely 7 bytes, while shifting the column address for the write data Data0 to DataN in the page 1300 by the amount of the shift unit at each E/W cycle, the controller 130 may initialize the offset at the next E/W cycle, and may write the write data Data0 to DataN 1362 to 1366 into the region starting from location C0 corresponding to the initial column address of the page 1300. And then again, at each of second to eighth E/W cycles E/W1 to E/W7, the controller 130 may write more write data Data0 to DataN into regions of the page 1300 starting from the locations C1 to C7 corresponding to the column addresses, which are shifted from the previous column address by the amount of the shift unit, respectively, as shown in FIG. 13.

Therefore, in accordance with an exemplary embodiment of the present invention, the controller 130 may perform the write operation to have similar effect to the write operation to the page 1300 while changing the random seed at each E/W cycle.

Figure 14:
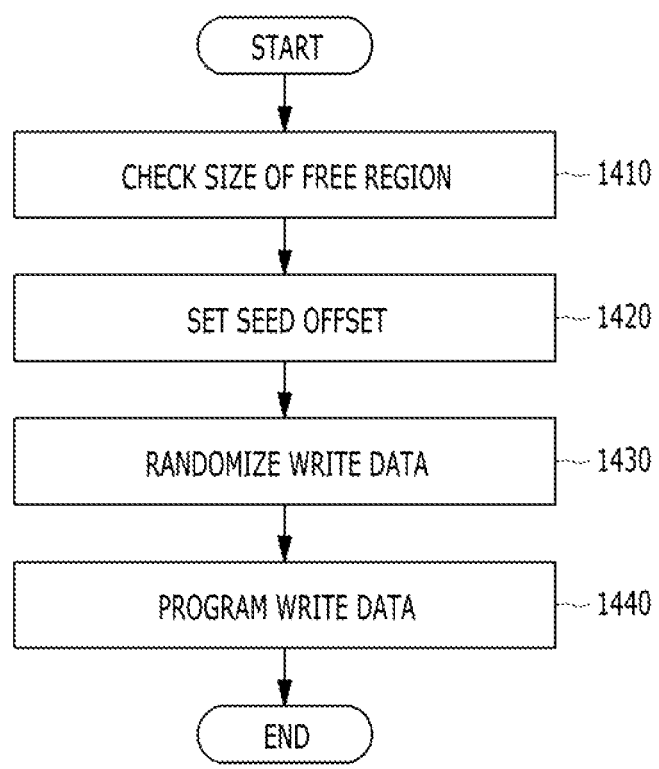
FIG. 14 is a flowchart illustrating an operation of a controller in accordance with the embodiment of the present invention.

FIG. 14 is a flowchart illustrating the operation of the controller 130 in accordance with the embodiment of the present invention.

Referring to FIGS. 1, 13 and 14, during the write operation, the controller 130 may check the size of the restricted region at step 1410.

At step 1420, the controller 130 may set the seed offset based on the size of the restricted region. In other words, the controller 130 may set the shift unit as well as the maximum shift. The shift amount of the column address in the restricted region for the write data or the randomized program location may be determined by the seed offset.

At step 1430, the controller 130 may randomize the write data by shifting the column address in the page 1300 of the restricted region for the write data according to the shift amount determined by the seed offset. That is, the controller 130 may randomize the write data by shifting the column address of the page 1300 of the restricted region for the write data at each E/W cycle according the shift amount of the column address determined by the seed offset. When the shift amount reaches the maximum shift while shifting the column address in the page 1300 of the restricted region for the write data by the amount of the shift unit at each E/W cycle, the controller 130 may initialize the offset at the next E/W cycle.

At step 1440, the controller 130 may write the randomized write data at the randomized program location in the page 1300 of the restricted region according to the shifted column address. That is, the controller 130 may randomize the write data by shifting the column address of the page 1300 of the restricted region for the write data at each E/W cycle according the shift amount of the column address determined by the seed offset.

In accordance with the embodiments of the present invention, the controller 130 and the operating method thereof may minimize the complexity and degradation in performance of the memory system, thereby stably and efficiently processing data to the memory device.

Although various embodiments have been described for illustrative purposes, it will be apparent to those skilled in the art that various changes and modifications may be made without departing from the spirit and scope of the invention as defined in the following claims.

What is claimed is:

1. A memory system comprising:
   a memory device comprising at least a page; and
   a controller configured to check a size of a restricted region in the page, set a seed offset according to the size of the restricted region in the page, randomize data using the seed offset at each cycle, and store the randomized data in the page,
   wherein the cycle is one of a program/erase (P/E) cycle and an erase/write (E/W) cycle, and
   wherein the restricted region is not used for storing data in the page.

2. The memory system of claim 1, wherein the controller randomizes the data by shifting a column address of the page for the data according to the seed offset at each cycle.

3. The memory system of claim 1, wherein the seed offset includes a shift unit representing a shift amount of a column address for the data within the size of the restricted region at each cycle, and a maximum shift representing a maximum shift amount of the column address within the size of the restricted region.

4. The memory system of claim 3, wherein the controller is configured to randomize the data by shifting the column address in the page for the data by an amount of the shift unit at each cycle.

5. The memory system of claim 4, wherein the controller is configured to initialize the shifting of the column address when the shift amount of the column address reaches the maximum shift.

6. The memory system of claim 1, wherein the restricted region comprises one or more of an unused region, a spare region, a remaining region, and a reserved region of the page.

7. An operating method of a memory system which includes at least a page of a memory device, the operation method comprising:
 temporarily storing data received from a host into a buffer;
 checking a size of a restricted region in the page based on a size of the data temporarily stored in the buffer;
 setting a seed offset according to the size of the restricted region in the page;
 randomizing the data using the seed offset at each cycle; and
 storing the randomized data in the page,
 wherein the cycle is one of a P/E cycle and an E/W cycle, and
 wherein the restricted region is not used for storing data in the page.

8. The memory system of claim 7, wherein the randomizing of the data is performed by shifting a column address of the page for the data according to the seed offset at each cycle.

9. The memory system of claim 7, wherein the seed offset includes a shift unit representing a shift amount of a column address for the data within the size of the restricted region at each cycle, and a maximum shift representing a maximum shift amount of the column address within the size of the restricted region.

10. The memory system of claim 9, wherein the randomizing of the data is performed by shifting the column address in the page for the data by an amount of the shift unit at each cycle.

11. The memory system of claim 10, wherein the randomizing of the data initializes the shifting of the column address when the shift amount of the column address reaches the maximum shift.

12. The memory system of claim 7, wherein the restricted region comprises one or more of an unused region, a spare region, a remaining region, and a reserved region of the page.

* * * * *